United States Patent
Muraoka

(10) Patent No.: US 9,354,279 B2
(45) Date of Patent: May 31, 2016

(54) MAGNETIC SENSOR DEVICE FOR GENERATING AN OUTPUT IN ACCORDANCE WITH A MAGNETIC FIELD INTENSITY APPLIED TO A MAGNETOELECTRIC CONVERSION HALL EFFECT ELEMENT

(71) Applicant: Seiko Instruments Inc., Chiba-shi, Chiba (JP)

(72) Inventor: Daisuke Muraoka, Chiba (JP)

(73) Assignee: SII SEMICONDUCTOR CORPORATION, Chiba (JP)

( * ) Notice: Subject to any disclaimer, the term of this patent is extended or adjusted under 35 U.S.C. 154(b) by 531 days.

(21) Appl. No.: 13/766,303

(22) Filed: Feb. 13, 2013

(65) Prior Publication Data

US 2013/0214772 A1    Aug. 22, 2013

(30) Foreign Application Priority Data

Feb. 16, 2012    (JP) .................................. 2012-031935

(51) Int. Cl.
*G01R 33/07*    (2006.01)
*G01R 33/00*    (2006.01)

(52) U.S. Cl.
CPC ........ *G01R 33/0017* (2013.01); *G01R 33/0029* (2013.01); *G01R 33/07* (2013.01)

(58) Field of Classification Search
CPC ........... G01R 33/0017; G01R 33/0035; G01R 33/0041; G01R 33/0206; G01R 33/06; G01R 33/07; G01R 33/072; G01R 33/075; G01R 33/077; G01R 33/09; G01R 33/091; G01R 33/093; G01R 33/095; G01R 33/096; G01R 33/098; G01D 5/142; G01D 5/145; G01D 5/147; G01D 5/16; G01B 7/30
See application file for complete search history.

(56) References Cited

U.S. PATENT DOCUMENTS

| | | | |
|---|---|---|---|
| 6,154,027 A * | 11/2000 | Alexander et al. | 324/251 |
| 7,492,149 B2 * | 2/2009 | Motz et al. | 324/207.2 |
| 8,193,807 B2 | 6/2012 | Muraoka et al. | |
| 2009/0009164 A1 * | 1/2009 | Utsuno | 324/251 |
| 2010/0134944 A1 * | 6/2010 | Yamamoto | H04B 5/00 361/143 |

FOREIGN PATENT DOCUMENTS

JP    2010-281801 A    12/2010

OTHER PUBLICATIONS

Electrical Engineering Dictionary, Ed. Phillip A. Laplante, definition for equivalent circuit, Book/Definitions, CRC Press LLC, 2000, 2 pages.*
Hall Effect, obtained from HyperPhysics (http://hyperphysics.phy-astr.gsu.edu/hbase/magnetic/hall.html), obtained on Nov. 3, 2015, 3 pages.*

* cited by examiner

*Primary Examiner* — Jay Patidar
*Assistant Examiner* — David M. Schindler
(74) *Attorney, Agent, or Firm* — Brinks Gilson & Lione

(57) ABSTRACT

Provided is a magnetic sensor device, which is configured to connect each terminal of a Hall element to another end of a variable resistor having one end connected to GND by switching of four switches. Thus, a detection voltage level for a magnetic field intensity can be arbitrarily set with a small-scale circuit. The detection voltage level is determined only by the resistance ratio, and hence the influence of fluctuations in power supply voltage and manufacturing fluctuations can be suppressed. This configuration can simplify signal processing and achieve higher-speed signal processing.

4 Claims, 4 Drawing Sheets

MAGNETIC SENSOR DEVICE FOR GENERATING AN OUTPUT IN ACCORDANCE WITH A MAGNETIC FIELD INTENSITY APPLIED TO A MAGNETOELECTRIC CONVERSION HALL EFFECT ELEMENT

RELATED APPLICATIONS

This application claims priority under 35 U.S.C. §119 to Japanese Patent Application No. 2012-031935 filed on Feb. 16, 2012, the entire content of which is hereby incorporated by reference.

BACKGROUND OF THE INVENTION

1. Field of the Invention

The present invention relates to a magnetic sensor device for converting a magnetic field intensity into an electric signal, and for example, to a magnetic sensor device to be employed as a sensor for detecting an open/close state used in a flip phone, a notebook computer, or the like, or a sensor for detecting a rotational position of a motor.

2. Description of the Related Art

A magnetic sensor device has been employed as a sensor for detecting the open/close state used in a flip phone, a notebook computer, or the like, or a sensor for detecting a rotational position of a motor.

In the magnetic sensor device, a magnetoelectric conversion element (for example, Hall element) outputs a voltage proportional to a magnetic field intensity or a magnetic flux density, an amplifier amplifies the output voltage, and a comparator determines the voltage to output a binary signal of an H signal or an L signal. The output voltage of the magnetoelectric conversion element is minute, and hence, easily affected by an offset voltage (element offset voltage) of the magnetoelectric conversion element, an offset voltage (input offset voltage) of the amplifier or the comparator, or noise within a conversion device, which leads to a problem. The element offset voltage is mainly generated by a stress or the like exerted on the magnetoelectric conversion element by a package. The input offset voltage is mainly generated by a characteristic variation of an element that forms an input circuit of the amplifier. The noise is mainly generated by flicker noise of a monolithic transistor that forms a circuit, or thermal noise of the monolithic transistor or a resistive element.

There has been devised a magnetic sensor device which reduces an influence of the above-mentioned offset voltage of the magnetoelectric conversion element or the amplifier (for example, see Japanese Patent Application Laid-open No. 2010-281801). A conventional magnetic sensor device illustrated in FIG. 3 includes a Hall element 51 serving as a magnetoelectric conversion element, a switching circuit 52, a differential amplifier 53, a comparator 54, a detection voltage setting circuit 55, a first capacitor C51 and a second capacitor C52, and a first switch S51 and a second switch S52.

FIG. 4 illustrates a timing chart of the operation of the conventional magnetic sensor device. One period T of the detection operation is divided into a first detection state T1 and a second detection state T2 depending on the operation of the switching circuit 52. In the first detection state T1, a first pair of terminals A and C of the Hall element 51 inputs a power supply voltage, and a second pair of terminals B and D outputs a detection voltage. In the second detection state T2, the second pair of terminals B and D inputs the power supply voltage, and the first pair of terminals A and C outputs the detection voltage. One period T is further divided into a first sample phase F1, a second sample phase F2, and a comparison phase F3 depending on the open/close states of the respective switches. Then, in the comparison phase F3, offset components are removed.

In the conventional magnetic sensor device, however, the detection voltage setting circuit 55 formed of a bleeder resistor is required to be provided in order to set a detection voltage level for the magnetic field intensity, resulting in the complicated circuit configuration. Further, different power supply systems are necessary for the Hall element 51 and the detection voltage setting circuit 55, resulting in a problem in that an error occurs in the setting of the detection voltage level. Still further, as described above, the total of three signal processing periods, two sample phases and one comparison phase, are necessary for removing the offset components.

SUMMARY OF THE INVENTION

It is an object of the present invention to provide a magnetic sensor device capable of accurately setting a detection voltage level and performing high-speed signal processing with a simple circuit configuration using a combination of a Hall element and a resistor.

In order to solve the above-mentioned problem inherent in the related art, the magnetic sensor device according to an exemplary embodiment of the present invention is configured as follows.

By switching of four switches, each terminal of a Hall element can be connected to another terminal of a variable resistor having one end connected to GND.

According to the magnetic sensor device of the present invention, the detection voltage level for the magnetic field intensity can be arbitrarily set with a small-scale circuit. The detection voltage level is determined only by the resistance ratio, and is therefore not affected by fluctuations in power supply voltage and manufacturing fluctuations. The magnetic sensor device can also be dealt with spinning current, and hence can cancel out offsets of the Hall element. Further, the detection voltage can be set regardless of the polarity of an applied magnetic field, and hence fluctuations in the detection voltage between the polarities can be suppressed as well. Besides, this configuration can simplify signal processing and achieve higher-speed signal processing.

DETAILED DESCRIPTION OF THE PREFERRED EMBODIMENTS

First Embodiment

Figure 1:
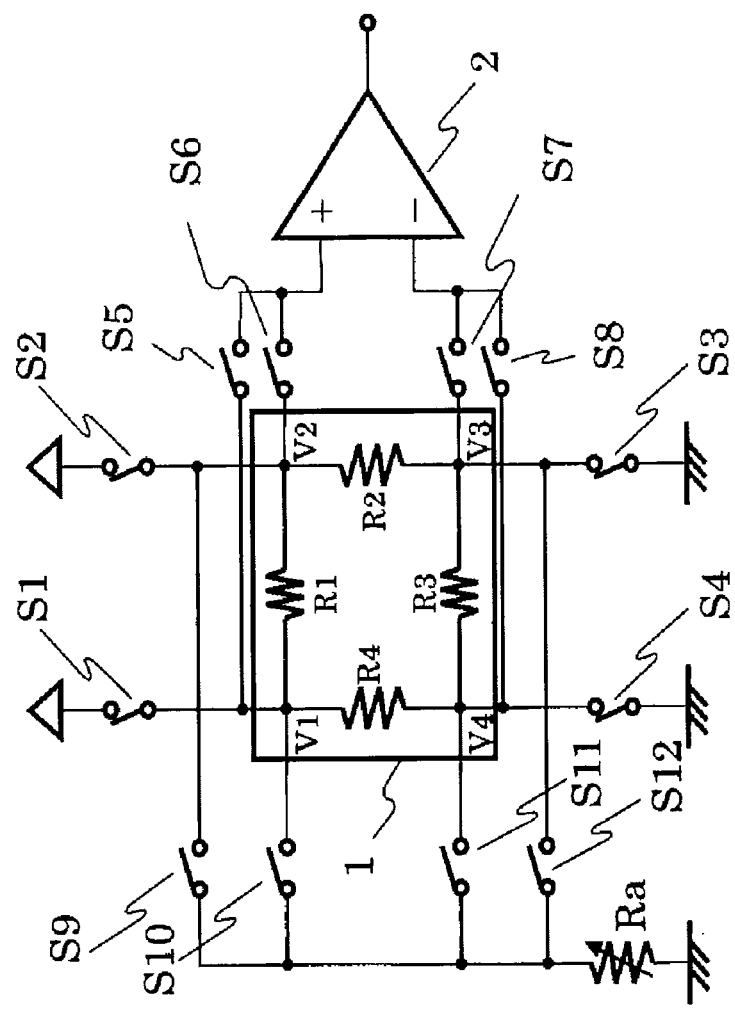
FIG. 1 is a circuit diagram illustrating a magnetic sensor device according to a first embodiment of the present invention.

FIG. 1 is a circuit diagram illustrating a magnetic sensor device according to a first embodiment of the present invention. The magnetic sensor device in this embodiment includes a Hall element 1 represented by an equivalent bridge circuit of resistors R1 to R4, a variable resistor Ra, a comparator 2, and switches S1 to S12.

The variable resistor Ra has one end connected to GND, and the other end connected to terminals V1 to V4 of the Hall element 1 via the switches S9 to S12, respectively. The terminals V1 and V2 are connected to a power source via the switches S1 and S2, respectively. The terminals V1 and V2 are also connected to a first input terminal of the comparator 2 via the switches S5 and S6, respectively. The terminals V3 and V4 are connected to GND via the switches S3 and S4, respectively. The terminals V3 and V4 are also connected to a second input terminal of the comparator 2 via the switches S7 and S8, respectively.

Next, the operation of the magnetic sensor device is described. As a first phase, the switches S1, S3, S6, and S8 are turned OFF, and the switches S2, S4, S5, and S7 are turned ON. Depending on the polarity of a magnetic field to be detected, one of the switch S10 and the switch S12 is turned ON and the other switch is turned OFF.

For example, it is supposed that the switch S10 is turned ON and the switches S9, S11, and S12 are turned OFF in the first phase. When the voltage of the terminal V1 and the voltage of the terminal V3 at which the output of the comparator 2 is inverted are equal to each other, the relationship of Expression (1) is established.

$$Ra = R1*R3*R4/(R2*R4 - R1*R3) \quad (1)$$

Provided that R1=R2=R3=R4=R is established in the state in which no magnetic field is present and the respective resistance values have a variation $\Delta R$ in the state in which a certain level of magnetic field is applied, R1=R−$\Delta R$, R2=R+$\Delta R$, R3=R−$\Delta R$, and R4=R+$\Delta R$ are expected to be established in the above-mentioned state of Expression (1). Those values are substituted into Expression (1) to derive Expression (2).

$$Ra = R^2*(1 - \Delta R/R - (\Delta R/R)^2 + (\Delta R/R)^3)/(4*\Delta R) \quad (2)$$

$\Delta R$ is sufficiently smaller than R, and hence, when the second-order and third-order terms of ($\Delta R/R$) are ignored, Expression (3) is established.

$$\Delta R/R \approx 1/(1 + 4*Ra/R) \quad (3)$$

Therefore, in the present invention, the detection voltage can be determined only by the resistance ratio Ra/R without depending on fluctuations in power supply voltage and manufacturing fluctuations. As a result, highly-accurate setting of the detection voltage level can be realized.

Note that, also in the case where the switches S1, S3, S6, and S8 are turned ON and the switches S2, S4, S5, and S7 are turned OFF in the second phase, and in the case where the polarity of the applied magnetic field is opposite, the detection voltage setting expressed by Expression (3) can be performed by turning ON and OFF the switches S9 to S12 in the opposite manner to the above-mentioned case. Further, as is apparent from the foregoing, only one kind of variable resistor, that is, the variable resistor Ra, is required to be connected as the component other than the Hall element. Thus, fluctuations among elements less occur, and a magnetic sensor device having small fluctuations in detection voltage level can be realized.

Further, even when one end of the variable resistor Ra may be connected to VDD instead of GND, the same effects can be obtained.

Note that, the magnetic sensor device according to the embodiment of the present invention can be configured to output an analog signal by changing the comparator to a differential amplifier.

According to the present invention, spinning current (technique of canceling out an offset by alternating currents between the first and second phases) can also be performed without any modifications.

Then, when a combination of a differential amplifier, a capacitor, and a switch is provided downstream of the comparator as in the conventional magnetic sensor device, the first phase can be used as a sample phase, and the second phase can be used as a comparison phase. Thus, unlike the conventional case where three signal processing phases are necessary for removing an offset, the present invention can complete signal processing in two phases. As a result, the signal processing period can be shortened (higher-speed signal processing can be realized).

Second Embodiment

Figure 2:
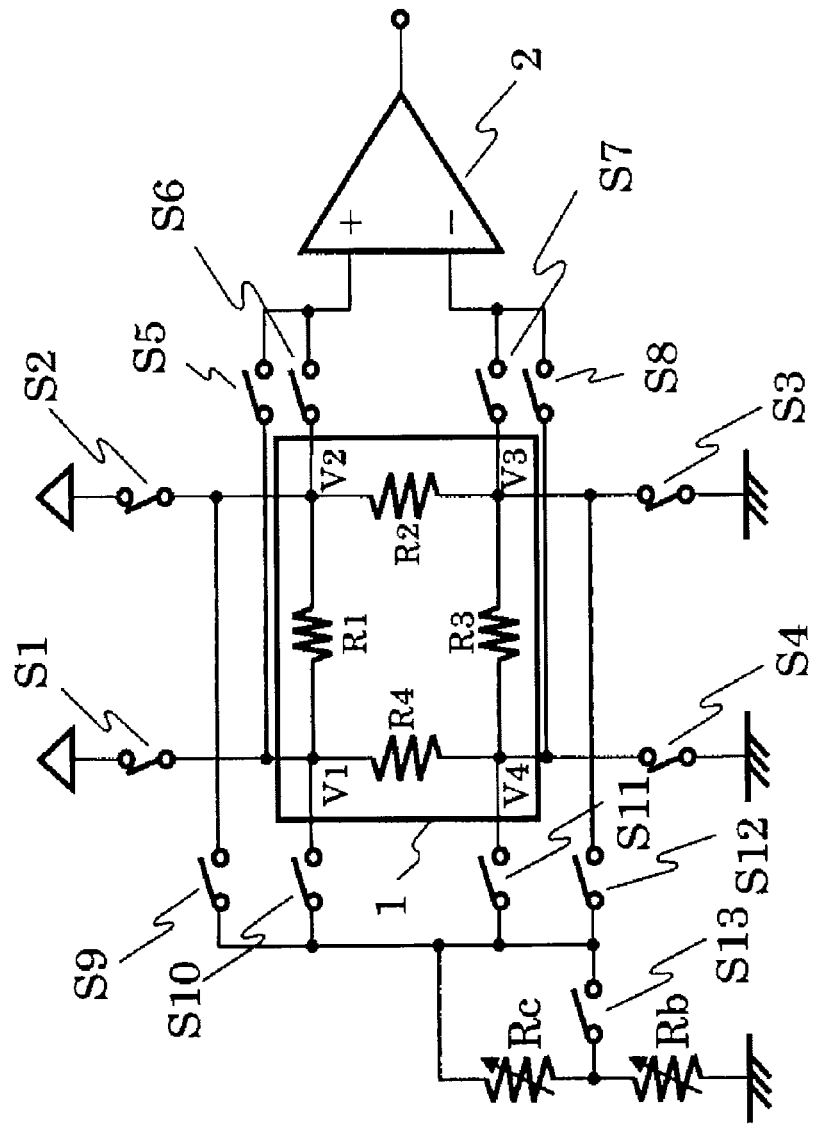
FIG. 2 is a circuit diagram of an application example of the magnetic sensor device according to the first embodiment of the present invention.
Figure 3:
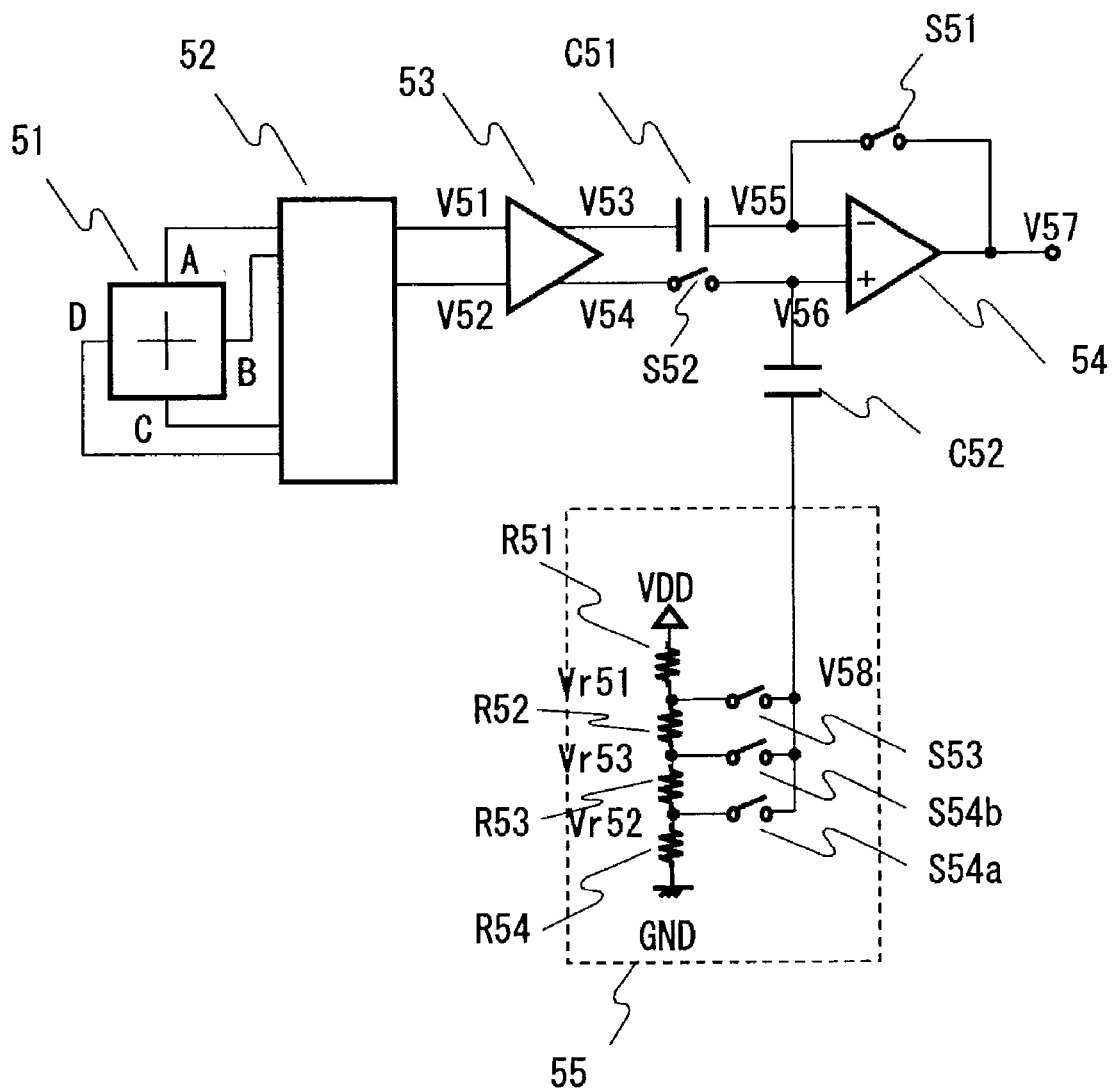
FIG. 3 is a circuit diagram of a conventional magnetic sensor device.
Figure 4:
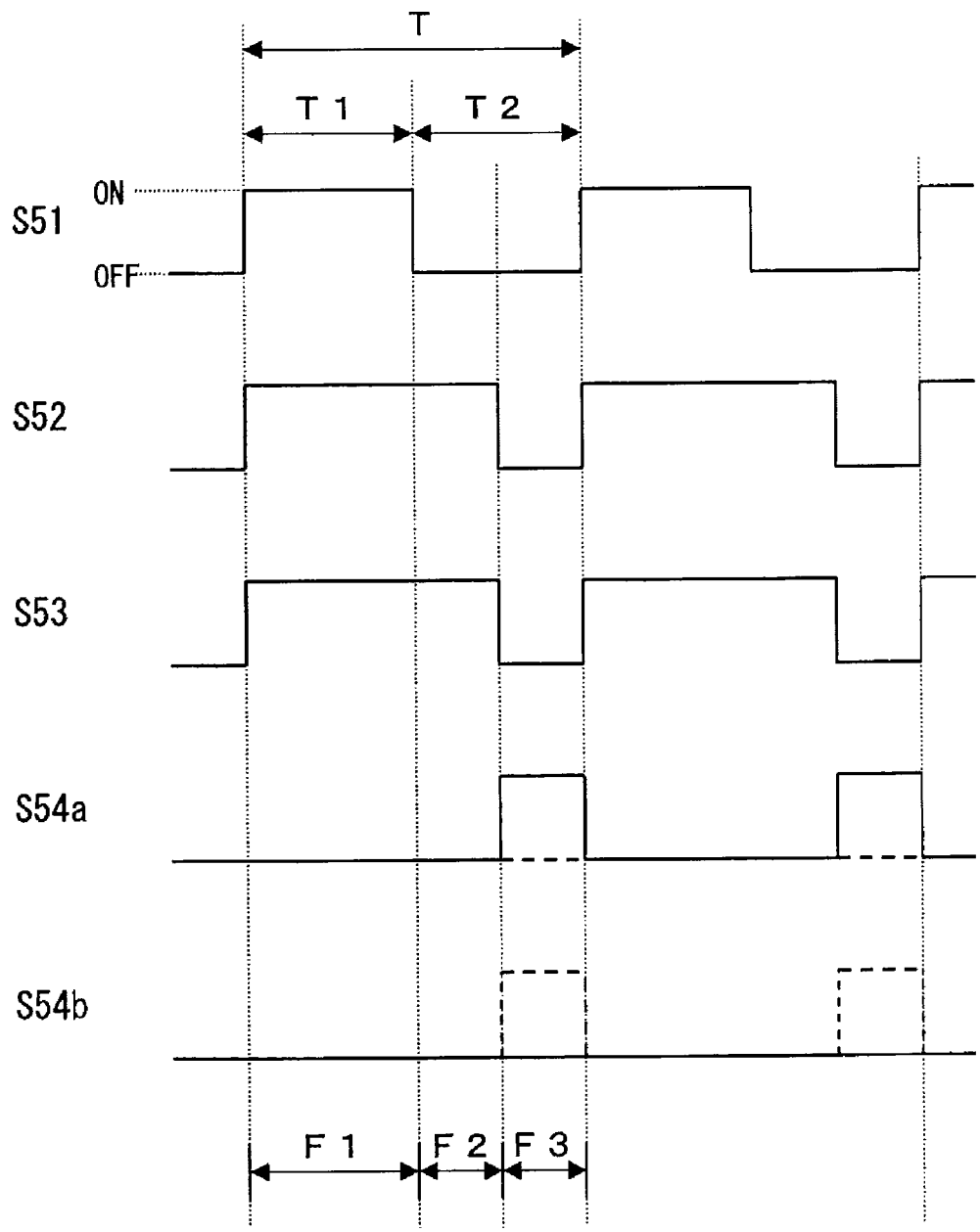
FIG. 4 is a timing chart of the conventional magnetic sensor device.

FIG. 2 illustrates a circuit diagram of a magnetic sensor device according to a second embodiment of the present invention. The second embodiment is different from the first embodiment in that the variable resistor Ra in the first embodiment is divided into a variable resistor Rb and a variable resistor Rc.

The variable resistor Rb has one end connected to GND, and the other end connected to one end of the variable resistor Rc and to the switches S9 to S12 via a switch S13. The variable resistor Rc has the other end connected to the switches S9 to S12.

In the case of setting a detection voltage, the switch S13 is turned ON to select the variable resistor Rb. In the case of setting a canceling voltage, the switch S13 is turned OFF to select the variable resistor Rb and the variable resistor Rc. In this manner, the magnetic sensor device in this embodiment is capable of setting a hysteresis between the detection voltage and the canceling voltage. In this case, Expressions (4) and (5) are established in the detection voltage setting and the canceling voltage setting, respectively.

$$\Delta R/R \approx 1/(1 + 4*Rb/R) \quad (4)$$

$$\Delta R/R \approx 1/(1 + 4*(Rb + Rc)/R) \quad (5)$$

Therefore, in the magnetic sensor device in this embodiment, a hysteresis can be set between the detection voltage and the canceling voltage for the magnetic field intensity in the first phase or the second phase.

Similarly to the first embodiment, the magnetic sensor device in this embodiment can be configured to output an analog signal by changing the comparator to a differential amplifier.

Spinning current (technique of canceling out an offset by alternating currents between the first and second phases) can also be performed without any modifications.

Then, when a combination of a differential amplifier, a capacitor, and a switch is provided downstream of the comparator as in the conventional magnetic sensor device, the first phase can be used as a sample phase, and the second phase can be used as a comparison phase. Thus, unlike the conventional case where three signal processing phases are necessary for removing an offset, the present invention can complete signal processing in two phases. As a result, the signal processing period can be shortened (higher-speed signal processing can be realized).

The magnetic sensor device according to the present invention may be used for alternation detection (for example, rotation detection of a motor). The magnetic sensor device for alternation detection is configured to switch from a state in which only one polarity (for example, S-pole) is detected to a state in which only another polarity (N-pole) is detected upon detection of the one polarity.

What is claimed is:

1. A magnetic sensor device comprising:
a first switch and a second switch each including one end connected to a power source;
a third switch and a fourth switch each including one end connected to a ground potential;
a comparator including a first input terminal, a second input terminal, and an output terminal;
a fifth switch and a sixth switch each including one end connected to the first input terminal of the comparator;
a seventh switch and an eighth switch each including one end connected to the second input terminal of the comparator;
a first variable resistor including one end connected to the ground potential;
a ninth switch, a tenth switch, an eleventh switch, and a twelfth switch each including one end connected to another end of the variable resistor; and
a Hall element including a first terminal, a second terminal, a third terminal, and a fourth terminal,
wherein the first terminal is connected to another end of the first switch, another end of the fifth switch, and another end of the tenth switch, the second terminal is connected to another end of the second switch, another end of the sixth switch, and another end of the ninth switch, the third terminal is connected to another end of the third switch, another end of the seventh switch, and another end of the twelfth switch, and the fourth terminal is connected to another end of the fourth switch, another end of the eighth switch, and another end of the eleventh switch.

2. The magnetic sensor device according to claim 1, further comprising a second variable resistor connected in series to the first variable resistor, wherein a connection point between the first variable resistor and the second variable resistor is connected to a thirteenth switch.

3. A magnetic sensor device comprising:
a first switch and a second switch each including one end connected to a power source;
a third switch and a fourth switch each including one end connected to a ground potential;
a differential amplifier including a first input terminal, a second input terminal, and an output terminal;
a fifth switch and a sixth switch each including one end connected to the first input terminal of the comparator;
a seventh switch and an eighth switch each including one end connected to the second input terminal of the comparator;
a variable resistor including one end connected to the ground potential;
a ninth switch, a tenth switch, an eleventh switch, and a twelfth switch each including one end connected to another end of the variable resistor; and
a Hall element including a first terminal, a second terminal, a third terminal, and a fourth terminal,
wherein the first terminal is connected to another end of the first switch, another end of the fifth switch, and another end of the tenth switch, the second terminal is connected to another end of the second switch, another end of the sixth switch, and another end of the ninth switch, the third terminal is connected to another end of the third switch, another end of the seventh switch, and another end of the twelfth switch, and the fourth terminal is connected to another end of the fourth switch, another end of the eighth switch, and another end of the eleventh switch.

4. A magnetic sensor device comprising
a first switch and a second switch each including one end connected to a power source;
a third switch and a fourth switch each including one end connected to a ground potential;
a differential amplifier including a first input terminal, a second input terminal, and an output terminal;
a fifth switch and a sixth switch each including one end connected to the first input terminal of the comparator;
a seventh switch and an eighth switch each including one end connected to the second input terminal of the comparator;
at least one variable resistor including one end connected to the ground potential;
a ninth switch, a tenth switch, an eleventh switch, and a twelfth switch each including one end connected to another end of the variable resistor; and
a Hall element including a first terminal, a second terminal, a third terminal, and a fourth terminal,
wherein the first terminal is connected to another end of the first switch, another end of the fifth switch, and another end of the tenth switch, the second terminal is connected to another end of the second switch, another end of the sixth switch, and another end of the ninth switch, the third terminal is connected to another end of the third switch, another end of the seventh switch, and another end of the twelfth switch, and the fourth terminal is connected to another end of the fourth switch, another end of the eighth switch, and another end of the eleventh switch, and
wherein the at least one variable resistor comprises at least a first variable resistor and a second variable resistor connected in series, wherein an end of one of the first and second variable resistor components comprises the another end of the variable resistor and a connection point between the first variable resistor and the second variable resistor is connected the another end of the variable resistor via a thirteenth switch.

* * * * *